United States Patent
Wang et al.

(10) Patent No.: US 11,133,211 B2
(45) Date of Patent: Sep. 28, 2021

(54) CERAMIC BASEPLATE WITH CHANNELS HAVING NON-SQUARE CORNERS

(71) Applicant: Lam Research Corporation, Fremont, CA (US)

(72) Inventors: Feng Wang, Sunnyvale, CA (US); Eric A. Pape, Campbell, CA (US)

(73) Assignee: LAM RESEARCH CORPORATION, Fremont, CA (US)

(*) Notice: Subject to any disclaimer, the term of this patent is extended or adjusted under 35 U.S.C. 154(b) by 327 days.

(21) Appl. No.: 16/108,416

(22) Filed: Aug. 22, 2018

(65) Prior Publication Data

US 2020/0066564 A1   Feb. 27, 2020

(51) Int. Cl.
H01L 21/683   (2006.01)
H01L 21/67    (2006.01)

(52) U.S. Cl.
CPC .... *H01L 21/6833* (2013.01); *H01L 21/67103* (2013.01)

(58) Field of Classification Search
CPC ........... H01L 21/6833; H01L 21/67103; H01L 21/6831; H01L 21/67248; H01L 21/67109
See application file for complete search history.

(56) References Cited

U.S. PATENT DOCUMENTS

| | | | | |
|---|---|---|---|---|
| 4,814,030 A * | 3/1989 | Dubuisson | ............ | H01L 23/467 156/155 |
| 4,859,520 A | 8/1989 | Dubuisson et al. | | |
| 5,575,872 A * | 11/1996 | Tsukada | ................. | B28B 1/002 156/89.15 |
| 6,147,334 A * | 11/2000 | Hannigan | ......... | H01L 21/67103 118/725 |
| 6,471,913 B1 * | 10/2002 | Weaver | ............. | H01L 21/67103 118/725 |
| 10,475,687 B2 * | 11/2019 | Kosakai | ............ | H01L 21/67103 |
| 2002/0096508 A1 * | 7/2002 | Weaver | ............. | H01L 21/67103 219/444.1 |
| 2006/0076109 A1 * | 4/2006 | Holland | .............. | H01L 21/6831 156/345.27 |
| 2014/0023794 A1 * | 1/2014 | Mahajani | ................ | C23C 16/36 427/535 |
| 2014/0319672 A1 * | 10/2014 | Tsubokawa | ....... | H01J 37/32715 257/712 |
| 2015/0332942 A1 * | 11/2015 | Peh | ....................... | H01L 21/687 165/253 |
| 2016/0230281 A1 * | 8/2016 | Lin | ................... | H01J 37/32724 |

(Continued)

FOREIGN PATENT DOCUMENTS

| JP | 5714119 B2 | 5/2015 |
|---|---|---|
| JP | 2017208565 A | 11/2017 |
| WO | WO-2014084334 A1 | 6/2014 |

OTHER PUBLICATIONS

International Search Report and Written Opinion for PCT Application No. PCT/US2019/046678 dated Dec. 2, 2019; 11 Pages.

*Primary Examiner* — Yusef A Ahmed

(57) ABSTRACT

A substrate support includes: a first plate configured to support a substrate; and a second plate that is connected to the first plate. The second plate includes at least one of: an internal coolant channel configured to receive coolant; and an internal gas channel configured to receive gas. The at least one of the internal coolant channel and the internal gas channel includes one of: chamfered internal corners; and staired internal corners.

16 Claims, 8 Drawing Sheets

(56) References Cited

U.S. PATENT DOCUMENTS

| | | | |
|---|---|---|---|
| 2016/0240385 A1* | 8/2016 | Citla | H01L 21/02071 |
| 2016/0372352 A1* | 12/2016 | Wu | H01L 22/12 |
| 2017/0133244 A1* | 5/2017 | Knyazik | F28F 3/12 |
| 2017/0140970 A1* | 5/2017 | Boyd, Jr. | H01L 21/6875 |
| 2017/0332481 A1* | 11/2017 | Ohkura | H05K 1/0212 |
| 2017/0338140 A1* | 11/2017 | Pape | H01L 21/68735 |
| 2018/0005867 A1* | 1/2018 | Pape | H01L 21/68785 |
| 2018/0012785 A1* | 1/2018 | Matyushkin | H01L 21/67109 |
| 2018/0040499 A1* | 2/2018 | Anada | H01L 21/6831 |
| 2018/0138069 A1* | 5/2018 | Tan | H01L 21/68721 |
| 2018/0148835 A1* | 5/2018 | Erickson | C23C 16/4411 |
| 2019/0013231 A1* | 1/2019 | Yamaguchi | H01L 21/67248 |
| 2019/0088518 A1* | 3/2019 | Koh | H01L 21/67103 |
| 2019/0267218 A1* | 8/2019 | Wang | H01L 21/6831 |
| 2020/0243368 A1* | 7/2020 | Boyd, Jr. | H01L 21/68757 |

* cited by examiner

CERAMIC BASEPLATE WITH CHANNELS HAVING NON-SQUARE CORNERS

FIELD

The present disclosure relates to substrate supports for substrate processing systems and more specifically to channels through ceramic baseplates of substrate supports.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to treat substrates, such as semiconductor wafers. Example processes that may be performed on a substrate include, but are not limited to, deposition, etching, cleaning, and other types of processes. A substrate may be arranged on a substrate support, such as a pedestal or an electrostatic chuck (ESC), in a processing chamber. During processing, gas mixtures may be introduced into the processing chamber and plasma may be used to initiate chemical reactions.

A temperature of a substrate (e.g., a semiconductor wafer) in a processing chamber can be controlled. Heaters can be arranged in the substrate support assembly, and the power supplied to the heaters can be controlled to control the temperature of a substrate on the substrate support. Coolant can be circulated through one or more coolant channels in the substrate support using valves to heat and/or cool the substrate and the substrate support.

SUMMARY

In a feature, a substrate support for a substrate processing chamber is described. The substrate support includes: a first plate configured to support a substrate; and a second plate that is connected to the first plate and that includes at least one of: an internal coolant channel that is configured to receive coolant and that includes chamfered internal corners; and an internal gas channel that is configured to receive gas and that includes chamfered internal corners.

In further features, the second plate is made of a ceramic having a purity of at least 90 percent ceramic.

In further features, the second plate includes the internal coolant channel, and the internal coolant channel is arranged in a single fillar arrangement.

In further features, the second plate includes the internal coolant channel, and the internal coolant channel is arranged in a bifillar arrangement.

In further features, the second plate includes the internal gas channel, and the internal gas channel is arranged in a single fillar arrangement.

In further features, the second plate includes the internal gas channel, and the internal gas channel is arranged in a bifillar arrangement.

In further features, the second plate includes the internal gas channel, wherein the internal gas channel is configured to flow the gas to a surface of the substrate through the first plate.

In further features, the second plate further includes at least one electrode that is embedded in the second plate.

In further features, the second plate further includes at least one electrically conductive terminal that is embedded in the second plate and that contacts the at least one electrode.

In further features, no electrodes are embedded in the second plate.

In further features: the second plate includes N layers of ceramic material; N is an integer greater than or equal to 5; and the at least one of the internal coolant channel and the internal gas channel is defined by at least five of the N layers of ceramic material.

In a feature, a substrate support for a substrate processing chamber is described. The substrate support includes: a first plate configured to support a substrate; and a second plate that is connected to the first plate and that includes at least one of: an internal coolant channel that is configured to receive coolant and that includes staired internal corners; and an internal gas channel that is configured to receive gas and that includes staired internal corners.

In further features, the second plate is made of a ceramic having a purity of at least 90 percent ceramic.

In further features, the second plate includes the internal coolant channel, and the internal coolant channel is arranged in a single fillar arrangement.

In further features, the second plate includes the internal coolant channel, and the internal coolant channel is arranged in a bifillar arrangement.

In further features, the second plate includes the internal gas channel, and the internal gas channel is arranged in a single fillar arrangement.

In further features, the second plate includes the internal gas channel, and the internal gas channel is arranged in a bifillar arrangement.

In further features, the second plate includes the internal gas channel, wherein the internal gas channel is configured to flow the gas to a surface of the substrate through the first plate.

In further features, the second plate further includes at least one electrode that is embedded in the second plate.

In further features, the second plate further includes at least one electrically conductive terminal that is embedded in the second plate and that contacts the at least one electrode.

In further features, no electrodes are embedded in the second plate.

In further features: the second plate includes N layers of ceramic material; N is an integer greater than or equal to 5; and the at least one of the internal coolant channel and the internal gas channel is defined by at least five of the N layers of ceramic material.

In a feature, a substrate support for a substrate processing chamber is described. The substrate support includes: a first plate configured to support a substrate; and a second plate that that is connected to the first plate and that includes at least one of: an internal coolant channel that is configured to receive coolant and that includes a cross-section that has a first wall and a second wall opposing the first wall, each of the first and second walls having a first plurality of sections, wherein at least two or more of the first plurality of sections are not co-planar; and an internal gas channel that is configured to receive gas and that includes a cross-section that has a third wall and a fourth wall opposing the third wall, each of the third and fourth walls having a second plurality of sections, wherein at least two or more of the second plurality of sections are not co-planar.

In further features, at least one of: (a) the second plate includes the internal coolant channel and one of: (i) the internal coolant channel is arranged in a single fillar arrangement; and (ii) the internal coolant channel is arranged in a bifillar arrangement; and (b) the second plate includes the internal gas channel and one of: (i) the internal gas channel is arranged in a single fillar arrangement; and (ii) the internal gas channel is arranged in a bifillar arrangement.

In further features, the at least one of: the internal coolant channel includes more than four internal walls that define the internal coolant channel and more than four internal corners where the more than four internal walls intersect; and the internal gas channel includes more than four internal walls that define the internal gas channel and more than four internal corners where the more than four internal walls intersect.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

An electrostatic chuck (ESC) holds a substrate during processing of the substrate. The ESC holds the substrate in place using electrostatic force. The ESC may include a top plate and baseplate. The top plate may be formed of, for example, a dielectric material. The baseplate could be formed of one or more metals, such as aluminum, or ceramic.

The baseplate includes various channels, such as coolant channels and gas channels. A coolant system pumps coolant through the coolant channels, for example, to regulate the temperature of a substrate arranged on the ESC during processing. According to the present disclosure, the channels include staired, rounded, or chamfered corners. The shape of the corners of the channels minimizes a risk of breakage of the channels. Rectangular channels with square (90 degree) corners have a higher risk of breakage. The non-square shape of the corners of the channels may increase the reliability and lifetime of the baseplate.

Figure 1:
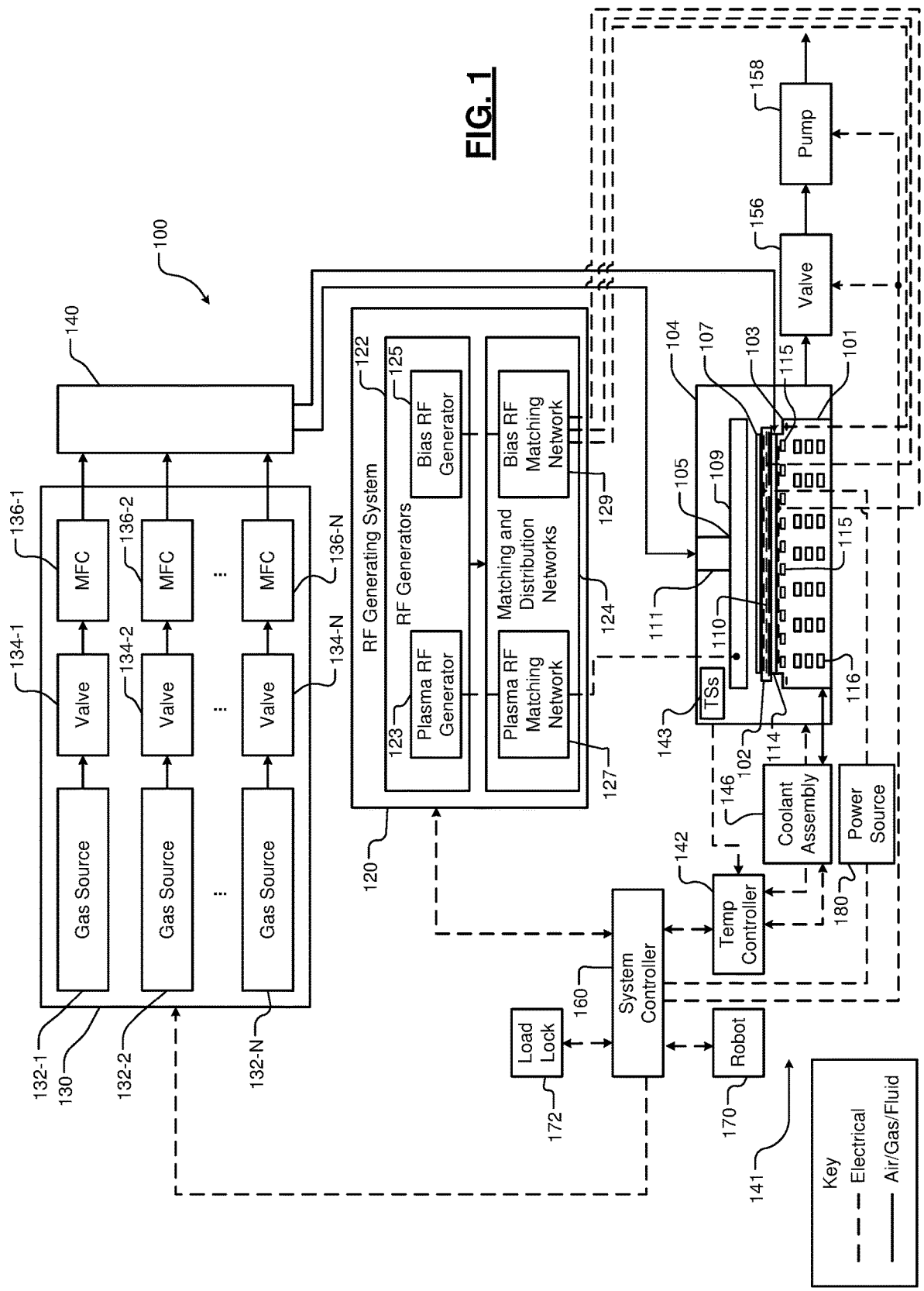
FIG. 1 is a functional block diagram of an example of a substrate processing system including an electrostatic chuck (ESC)

FIG. 1 is a substrate processing system 100 including an electrostatic chuck (ESC) 101. Although FIG. 1 shows a capacitive coupled plasma (CCP) system, the present application is also applicable to transformer coupled plasma (TCP) systems, electron cyclotron resonance (ECR) plasma systems, inductively coupled plasma (ICP) systems, and/or other systems and plasma sources that include a substrate support.

The ESC 101 includes a top plate 102 and a baseplate 103. The top plate 102 and the baseplate 103 are formed of ceramic and are void of metal. In various implementations, the top plate 102 and the baseplate 103 are formed of ceramic having a purity level of greater than or equal to 90% ceramic. The purity level of the ceramic may vary depending on the application. As examples, ceramic purity levels of the top plate 102 and the baseplate 103 may be greater than or equal to 90%, greater than or equal to 95%, or greater than or equal to 99.9%.

In various implementations, the baseplate 103 may include a thin protective coating of ceramic or a material other than ceramic. As a few examples, the top plate 102 and the baseplate 103 may be formed of alumina ($Al_2O_3$), aluminum nitride (AlN), silicon carbide (SiC), and/or another ceramic material. The thin protective coating may be formed of AlN, yttria ($Y_2O_3$), zirconium dioxide ($ZrO_2$), and/or another suitable material.

The top plate 102 and the baseplate 103 and other features are further described below. Although the ESC 101 is shown as being mounted to a bottom of a processing chamber and not being configured to be rotated, the ESC 101 may be mounted to a top of a processing chamber and/or may be configured as a spin chuck to be rotated during processing of a substrate. If mounted to a top of a processing chamber, the ESC 101 may be flipped upside down and may include peripheral substrate holding, clamping, and/or clasping hardware.

The substrate processing system 100 includes a processing chamber 104. The ESC 101 is enclosed within the processing chamber 104. The processing chamber 104 also encloses other components, such as an upper electrode 105, and contains radio frequency (RF) plasma. During operation, a substrate 107 is arranged on and electrostatically clamped to the top plate 102 of the ESC 101.

For example only, a showerhead 109 that introduces and distributes gases may include or serve as the upper electrode 105. The showerhead 109 may include a stem portion 111 including one end connected to a top surface of the processing chamber 104. The showerhead 109 is generally cylindrical and extends radially outward from an opposite end of the stem portion 111 at a location that is spaced from the top surface of the processing chamber 104. A substrate-facing surface of the showerhead 109 includes holes through which gas flows for processing. Alternately, the upper electrode 105 may include a conducting plate and the gases may be introduced in another manner. One or both of the top plate 102 and the baseplate 103 may include or serve as a lower electrode.

One or both of the top plate 102 and the baseplate 103 may include temperature control elements (TCEs). As an example, FIG. 1 shows the top plate 102 including TCEs 110. An intermediate layer 114 may be arranged between the top plate 102 and the baseplate 103. The intermediate layer 114 may bond or otherwise adhere the top plate 102 to the baseplate 103. As an example, the intermediate layer 114 may be formed of an adhesive material suitable for bonding the top plate 102 to the baseplate 103.

The baseplate 103 may include one or more gas channels 115 and/or one or more coolant channels 116. The gas channels 115 may flow backside gas to a backside of the substrate 107. The coolant channels 116 flow coolant through the baseplate 103.

An RF generating system 120 generates and outputs RF voltages to the upper electrode 105 and the lower electrode. One of the upper electrode 105 and the lower electrode may be DC grounded, AC grounded, or at a floating potential. For example only, the RF generating system 120 may include one or more RF generators 122 (e.g., a capacitive coupled plasma RF power generator, a bias RF power generator, and/or other RF power generator) that generate RF voltages. The output of the RF generator(s) 122 are fed by one or more matching and distribution networks 124 to the upper electrode 105 and/or the lower electrode. As an example, a plasma RF generator 123, a bias RF generator 125, a plasma RF matching network 127, and a bias RF matching network 129 are shown. The plasma RF generator 123 may be a high-power RF generator producing, for example 6-10 kilowatts (kW) of power or more. The bias RF matching network supplies power to RF electrodes in the top plate 102 and the baseplate 103.

A gas delivery system 130 includes one or more gas sources 132-1, 132-2, . . . , and 132-N (collectively gas sources 132), where N is an integer greater than zero. The gas sources 132 supply one or more precursors and gas mixtures thereof. The gas sources 132 may also supply etch gas, carrier gas, and/or purge gas. Vaporized precursor may also be used.

The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 104. For example only, the output of the manifold 140 may be fed to the showerhead 109.

The substrate processing system 100 further includes a cooling system 141 that includes a temperature controller 142. In various implementations, the TCEs 110 may be omitted. Although shown separately from a system controller 160, the temperature controller 142 may be implemented as part of the system controller 160. At least one of the top plate 102 and the baseplate 103 may include a plurality of temperature controlled zones (e.g., 4 zones), where each of the temperature controlled zones includes one or more temperature sensors and one or more of the TCEs 110. The temperature controller 142 may control operation of the TCEs 110 of a zone based on the temperature(s) measured by the temperature sensor(s) of that zone.

The temperature controller 142 may also control a flow rate of backside gas (e.g., helium) to the gas channels 115 from one or more of the gas sources 132. The temperature controller 142 may also control a temperature and a flowrate of coolant flowing through the coolant channels 116 via a coolant assembly 146. The coolant assembly 146 includes a coolant pump that pumps coolant from a reservoir to the coolant channels 116. The coolant assembly 146 may also include a heat exchanger that transfers heat away from the coolant, such as to air. The coolant may be, for example, a liquid coolant.

The temperature controller 142 controls operation of the TCEs 110, the flow of the backside gas, and the temperature and flow of the coolant based on parameters measured by temperature sensors (TSs) 143 and other types of sensors within the processing chamber 104. The temperature sensors 143 may include resistive temperature sensors, thermocouples, digital temperature sensors, and/or another suitable type of temperature sensor.

A valve 156 and pump 158 may be used to evacuate reactants from the processing chamber 104. A robot 170 may deliver substrates onto and remove substrates from the top plate 102 of the ESC 101. For example, the robot 170 may transfer substrates between the ESC 101 and a load lock 172. The system controller 160 may control operation of the robot 170. The system controller 160 may also control operation of the load lock 172.

A power source 180 may provide power to electrodes to electrostatically clamp a substrate to the ESC 101. The system controller 160 may control the application of power to the electrodes.

Figure 2:
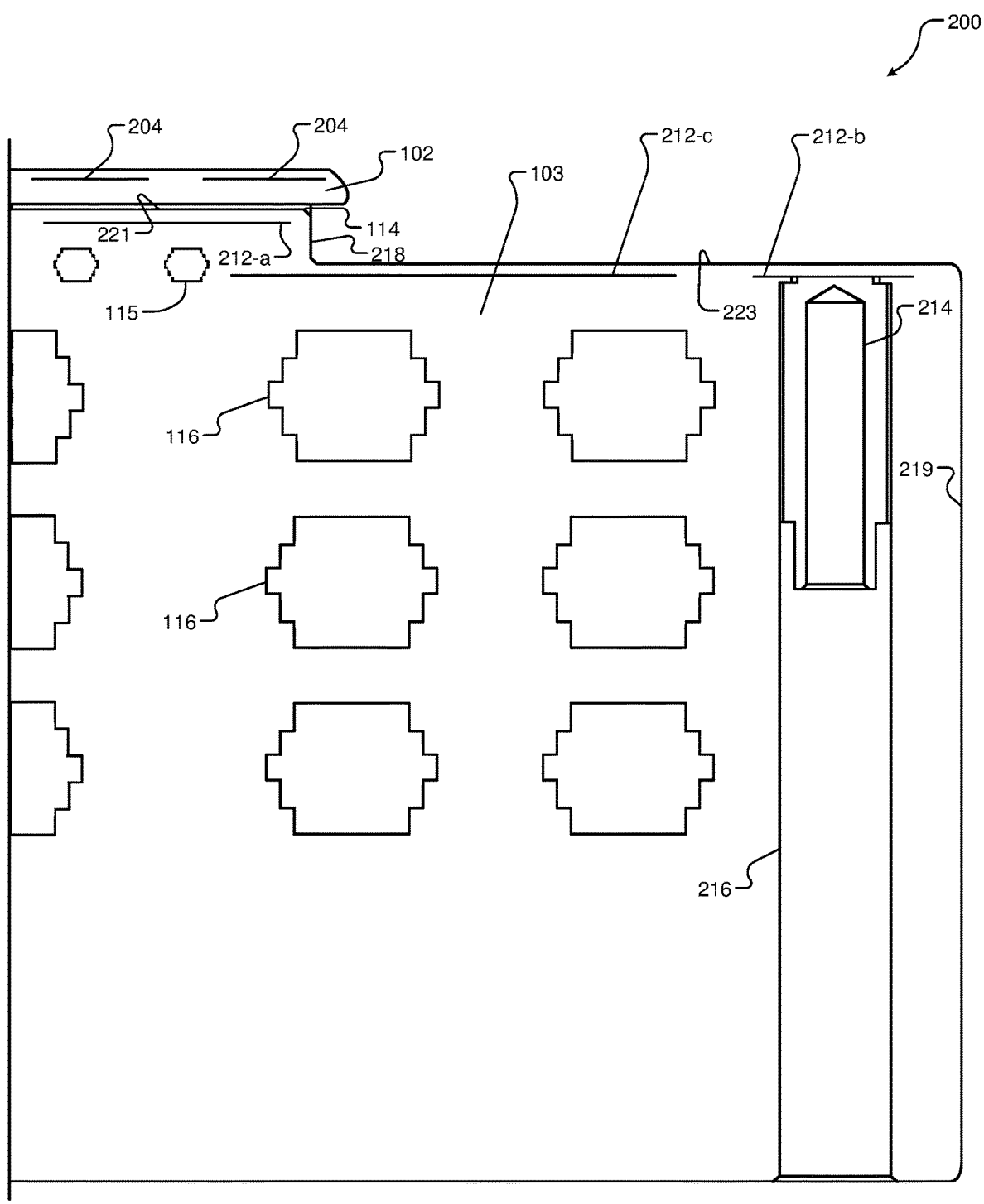
FIG. 2 is a cross-sectional side view of a portion of an example ESC.

FIG. 2 includes a cross-sectional side view of a portion 200 of an example implementation of the ESC 101 including the top plate 102, the intermediate layer 114, and the baseplate 103. The top plate 102 may be bonded to the baseplate 103 via the intermediate layer 114.

In various implementations, the baseplate 103 may include a protective coating over exterior surfaces of the baseplate 103. Examples of protective coatings include, but are not limited to, aluminum nitride (AlN), yttria ($Y_2O_3$), and zirconium dioxide ($ZrO_2$).

In the example shown, the top plate 102 includes electrostatic clamping electrodes 204 which may receive power from the power source 180. The electrostatic clamping electrodes 204 may be connected to electrically conductive terminals, and the electrically conductive terminals may be connected to the power source 180.

The baseplate 103 includes radio frequency (RF) electrodes 212-$a$, 212-$b$, 212-$c$ (collectively "RF electrodes 212"). The RF electrodes 212 may receive power from electrically conductive terminals, such as terminal 214, and the electrically conductive terminals may be connected to the bias RF matching network 129. The electrically conductive terminals are disposed in electrically insulated towers, such as tower 216, that extend from a bottom of the baseplate 103 to the RF electrodes 212.

The RF electrodes 212 may be disposed within predetermined distances of top surfaces of the baseplate 103. The RF electrodes 212 may be disposed in different patterns radially across the baseplate 103. The corresponding electrically conductive terminals may also be disposed in various patterns. As an example, the terminals may be equally spaced apart from each other, disposed at equal radial distances from a center of the ESC 101, or disposed at points to connect to the RF electrodes 212.

The RF electrodes 212 may be independently controlled or controlled in groups. When independently controlled, the RF electrodes 212 may be activated and deactivated at different times and receive different voltages and current levels. When controlled in groups, the RF electrodes 212 that are in a group may be activated at the same time, deactivated at the same time, and receive the same power from the same power source. Groups of the RF electrodes 212 may be controlled independently. Control of the RF electrodes 212 may provide more accurate temperature control across top surfaces of the ESC 101 and thus temperatures of a substrate during processing of the substrate, and provide increased control over RF power and voltage across the top surfaces of the ESC 101 and substrate. This provides increased control of plasma processing, such as etching and/or deposition processes.

One or more of the RF electrodes 212 (e.g., the RF electrode 212-a) may be disposed in an upper portion 218 of the baseplate 103 that protrudes upward from a lower portion 219 of the baseplate 103. The baseplate 103 may have one or more flat top surfaces and include one or more steps. In the example of FIG. 2, the baseplate 103 has a single step down from the upper portion 218 to the lower portion 219.

The upper portion 218 has an uppermost (or top) surface 221 and the lower portion 219 has an uppermost (or top) surface 223. The upper portion 218 has an outer diameter that is smaller than an outer diameter of the lower portion 219 and is smaller than an outer diameter of the top plate 102. The top plate 102 has an outer diameter that is smaller than the outer diameter of the lower portion 219. The stated outer diameters may vary depending on the application and corresponding component configurations.

One or more of the RF electrodes 212 (e.g., the RF electrode 212-b) may be disposed near an outer periphery of the lower portion 219. The RF electrode 212-b may be disposed below an edge ring centered on the upper portion 218. The upper portion 218 may be correspondingly shaped (e.g., conical) to other chamber components (e.g., a second edge ring) on the baseplate 103 and minimize gaps between the other chamber components and the upper portion 218.

One or more of the RF electrodes 212 (e.g., the RF electrode 212-c) may be disposed in the lower portion 219 such that at least a portion of the one or more of the RF electrodes 212 is disposed under the upper portion 218. Each of the RF electrodes 212 and/or groups of two or more of the RF electrodes 212 may be electrically connected to an electrically conductive terminal. For example, the RF electrode 212-b is illustrated as being electrically connected to the (electrically conductive) terminal 214. The RF electrodes 212 and other electrodes disclosed herein may be formed of, for example, Tungsten (W), Platinum (Pt), Silver (Ag), Palladium (Pd) and/or another electrically conductive material.

The baseplate 103 is formed of multiple ceramic layers. Channels, such as the gas channels 115 and the coolant channels 116 are formed in different ceramic layers of the baseplate 103 during formation of the baseplate 103.

The baseplate 103 may be formed from multiple ceramic layers that are stacked up and sintered together to form the baseplate 103. Each of the ceramic layers may include a mixture of (green state) ceramic material and a bonding material. The ceramic material may have a ceramic purity level of greater than or equal to 90%, greater than or equal to 95%, or greater than or equal to 99.9% The ceramic layers may be, for example, 1 millimeter (mm) thick or another suitable thickness. In various implementations, the ceramic layers may be pre-formed ceramic green sheets.

Each of the ceramic layers may include one or more than one openings and/or recesses for features of the baseplate 103, such as the gas channels 115, the coolant channels 116, the RF electrodes 212, the terminals, etc. The ceramic layers may be stacked on top of each other. The openings and/or recesses of a layer may be formed, for example, by machining, cutting (e.g., by laser), or formed in another manner.

The resulting stack of ceramic layers may be molded under pressure to form a green body. The green body may be baked in a furnace at a predetermined temperature for a predetermined period of time to allow the ceramic layers to bond together. The baseplate 103 resulting from the sintering of the green body can then be removed from the furnace.

The gas channels 115 may receive gas from the manifold 140. The gas channels 115 may be disposed on the same horizontal plane and in the same one or more layers of the baseplate 103. As an alternative, the gas channels 115 may be completely or partially disposed in different horizontal planes and in different layers of the baseplate 103. The gas channels 115 may be used to provide a backside gas to a back side of a substrate arranged on the top plate 102. Holes may be formed in the top plate 102 for gas to flow from the gas channels 115 through the top plate 102 to the back side (lower portion) of the substrate.

The coolant channels 116 may be arranged in one or more layers of coolant channels. The example of FIG. 2 illustrates the coolant channels 116 being arranged in three layers of coolant channels. Each layer of the coolant channels 116 is disposed on a horizontal plane and is formed in multiple different ceramic layers of the baseplate 103.

Figure 3:
FIG. 3 is a top view of an example bifilar arrangement of channels of an ESC.
Figure 4:
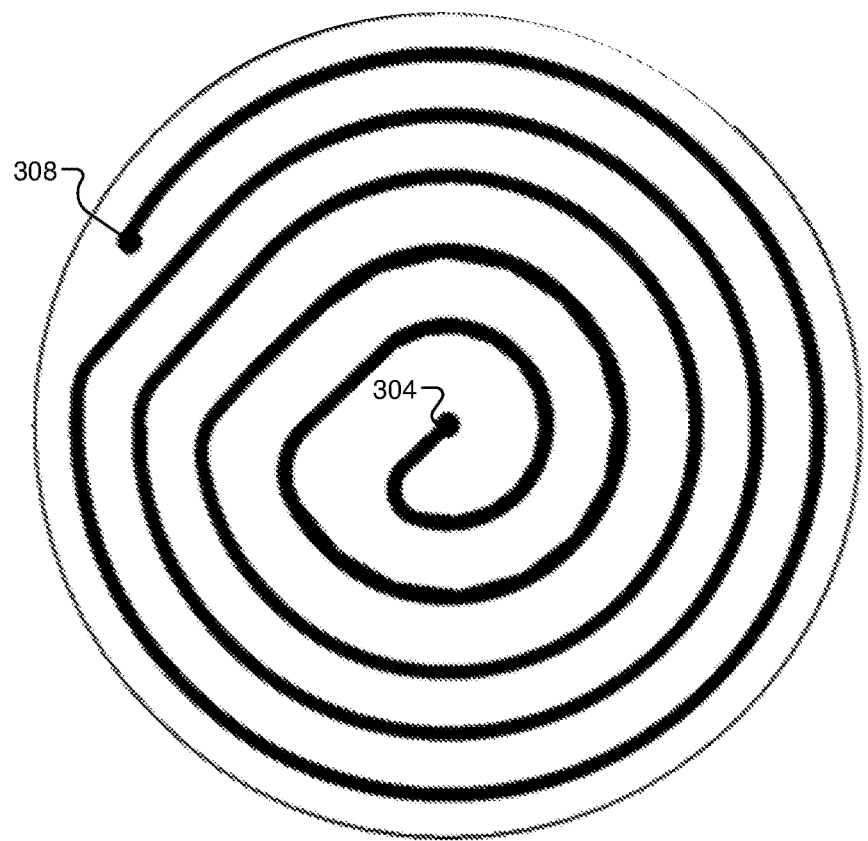
FIG. 4 is a top view of an example single fillar arrangement of channels of an ESC.

Each layer of the coolant channels 116 may be arranged in a bifilar arrangement or a single fillar arrangement. FIG. 3 includes a top view of an example bifilar arrangement of a layer of the coolant channels 116, and FIG. 4 includes a top view of an example single fillar arrangement of a layer of the coolant channels 116.

The coolant channels 116 receive (cool) coolant from the coolant assembly 146 via inlets, such as inlet 304 and outputs (warmer) coolant to the coolant assembly 146 via outlets, such as outlet 308. Each layer of the coolant channels 116 may have an inlet and an outlet. The inlet and outlet of each of the layers may be connected (vertically) such that the layers are connected in parallel. While example arrangements of the coolant channels 116 are shown, the coolant channels 116 may be arranged in another suitable configuration. The gas channels 115 may be arranged in a single fillar arrangement, a bifilar arrangement, or another suitable arrangement.

Figure 5:
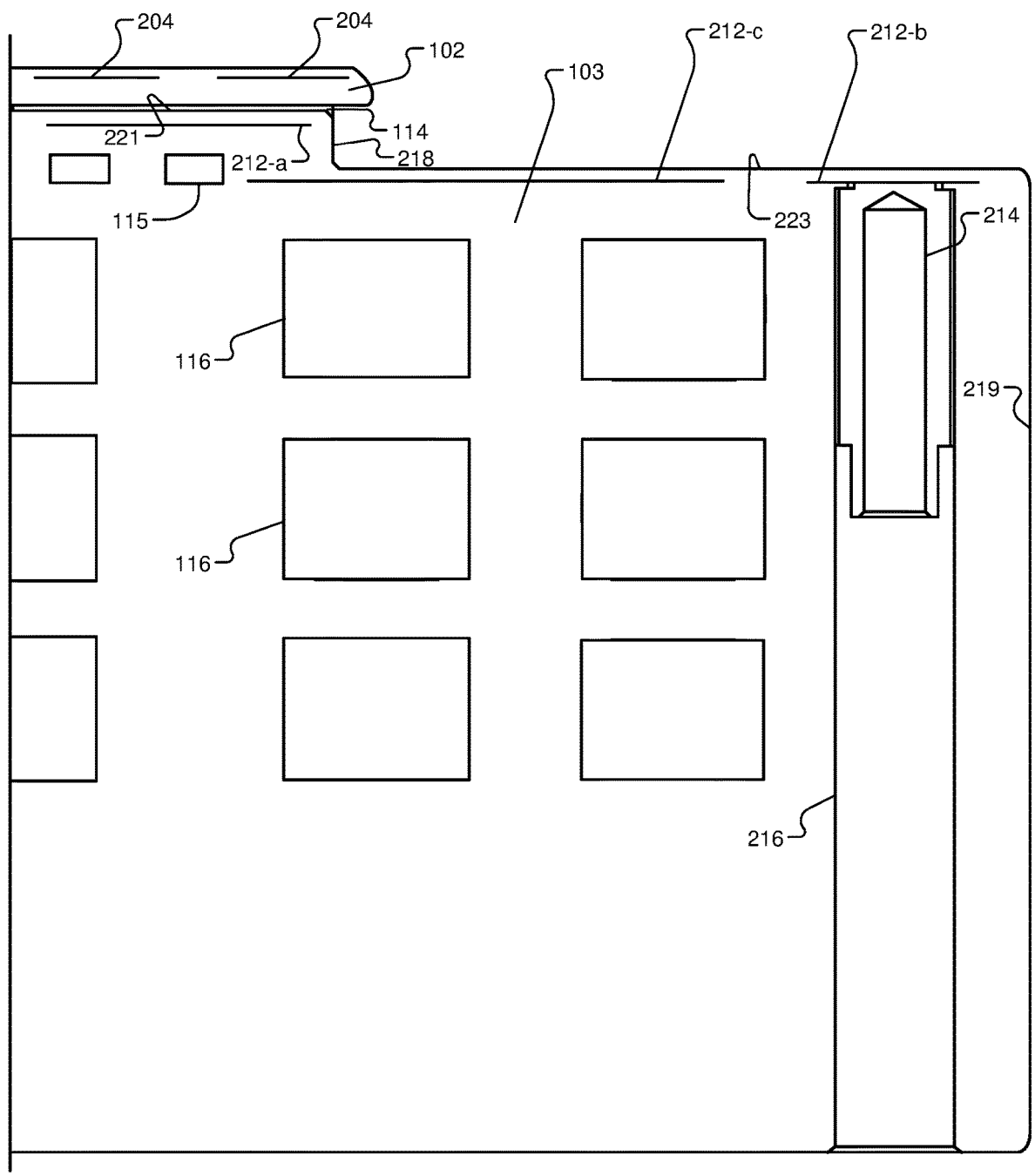
FIG. 5 includes a cross-sectional side view including coolant channels of an ESC having rectangular vertical cross-sections.

The coolant channels 116 are formed to have a non-rectangular shape when viewed on a cross-section that is normal to a direction of coolant flow through the coolant channels 116. For example, in the example of FIG. 2, the coolant channels 116 are shown as having staired (or stepped) corners. The coolant channels 116 may, however, have chamfered corners or rounded corners. The non-rectangular shape of the coolant channels 116 increases the internal strength of the baseplate 103 and reduces the risk of breakage of the coolant channels 116. This, in turn, increases the lifetime of the baseplate 103. By way of contrast, FIG. 5 includes a cross-sectional including an example illustration of the coolant channels 116 having rectangular cross-sections.

While the example of the coolant channels 116 being formed to have a non-rectangular shape will be described in detail, the gas channels 115 may also be formed to have a non-rectangular shape when viewed on a cross-section that is normal to a direction of gas flow through the gas channels 115. Alternatively, the gas channels 115 may have rectangular shape.

Figure 6A:
FIGS. 6A-6F include cross-sectional side views of a portion of an example ESC and illustrate an example method of forming one of the channels of the ESC.

FIGS. 6A-6F include cross-sectional side views of an example implementation of the ESC 101 and illustrate an example method of forming one of the coolant channels 116 of the ESC 101. FIG. 6A illustrates a first ceramic layer 604 of the ESC 101. The first ceramic layer 604 does not include an opening for the one of the coolant channels 116 and serves as a floor of the one of the coolant channels 116. The first ceramic layer 604 may also serve as the floor for other ones of the coolant channels 116 that are on the same horizontal plane as the one of the coolant channels 116.

Figure 6B:
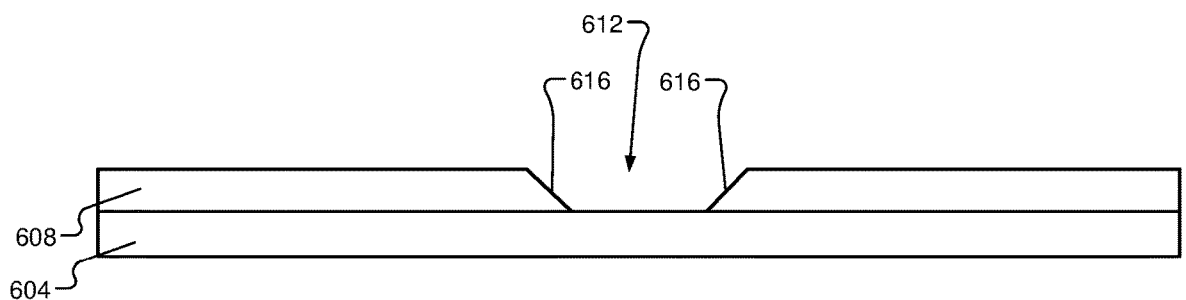

In FIG. 6B, a second ceramic layer 608 is stacked on the first ceramic layer 604. As shown, the second ceramic layer 608 includes an opening 612 formed with chamfered edges 616. The second ceramic layer 608 may also include openings with chamfered edges for other ones of the coolant channels 116 that are on the same horizontal plane as the one of the coolant channels 116.

Figure 6C:
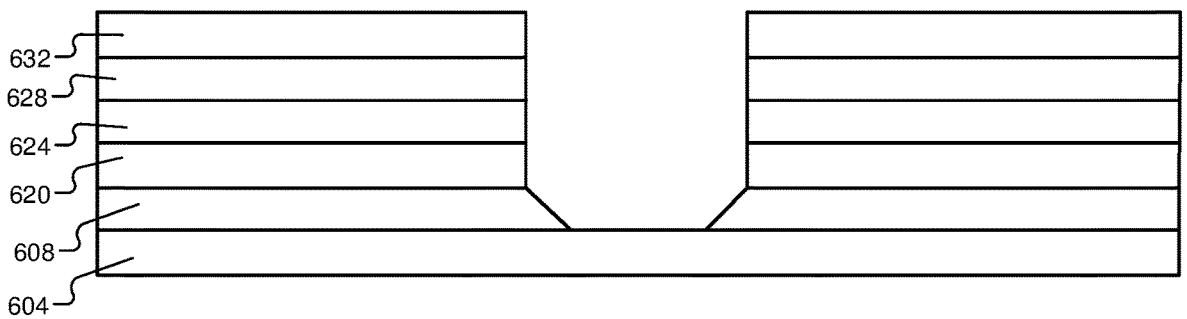

In FIG. 6C, a third ceramic layer 620 is stacked on the second ceramic layer 608. A fourth ceramic layer 624 is stacked on the third ceramic layer 620. A fifth ceramic layer 628 is stacked on the fourth ceramic layer 624. A sixth ceramic layer 632 is stacked on the fifth ceramic layer 628. The third, fourth, fifth, and sixth ceramic layers 620, 624, 628, and 632 include openings with straight (vertical and non-chamfered) edges. The openings of the third, fourth, fifth, and sixth ceramic layers 620, 624, 628, and 632 are disposed vertically above the opening 612 and align with the outer edges of the chamfered edges 616. While the example of four ceramic layers with openings having straight edges is provided, more or less ceramic layers with openings with straight edges may be used. The third, fourth, fifth, and sixth ceramic layers 620, 624, 628, and 632 may also include openings with straight edges for other ones of the coolant channels 116 that are on the same horizontal plane as the one of the coolant channels 116.

Figure 6D:
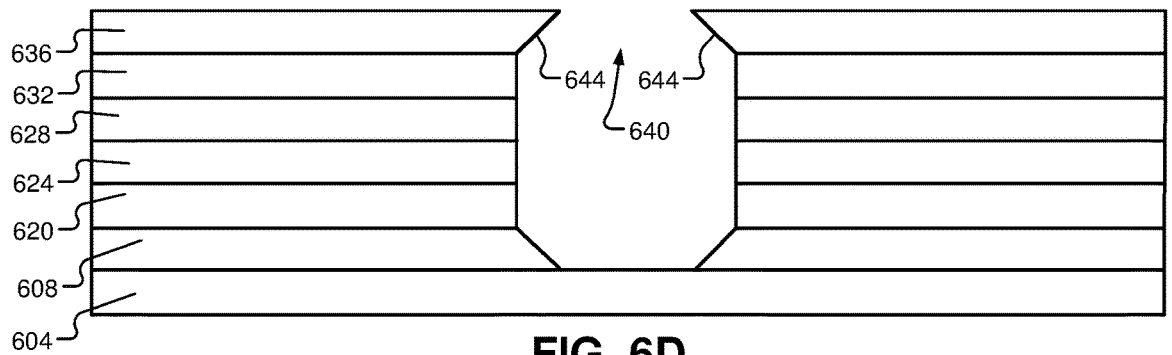

In FIG. 6D, a seventh ceramic layer 636 is stacked on the sixth ceramic layer 632. The seventh ceramic layer 636 includes an opening 640 formed with chamfered edges 644. The seventh ceramic layer 636 may also include openings with chamfered edges for other ones of the coolant channels 116 that are on the same horizontal plane as the one of the coolant channels 116. The opening 640 is disposed vertically above the openings of the third, fourth, fifth, and sixth ceramic layers 620, 624, 628, and 632 and the opening 612. The chamfered edges 644 align with the outer edges of the straight edges of the openings of the third, fourth, fifth, and sixth ceramic layers 608, 620, 624, 628, and 632. The openings of the second, third, fourth, fifth, sixth, and seventh ceramic layers 608, 620, 624, 628, 632, and 636 serve as the side walls of the one of the coolant channels 116.

Figure 6E:
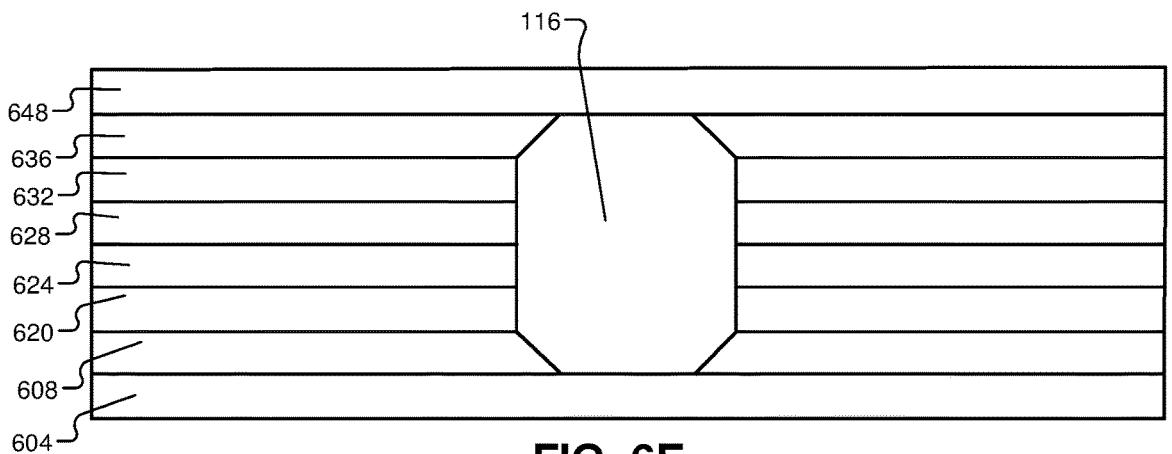

In FIG. 6E, an eighth ceramic layer 648 is stacked on the seventh ceramic layer 636. The eighth ceramic layer 648 does not include an opening for the one of the coolant channels 116. The eighth ceramic layer 648 closes the one of the coolant channels 116 and serves as a ceiling of the one of the coolant channels 116. The eighth ceramic layer 648 may also serve as the ceiling for other ones of the coolant channels 116 that are on the same horizontal plane as the one of the coolant channels 116. The eighth ceramic layer 648 (or another ceramic layer) may also serve as a floor of another one of the coolant channels 116 that is located vertically above the one of the coolant channels 116.

Figure 6F:
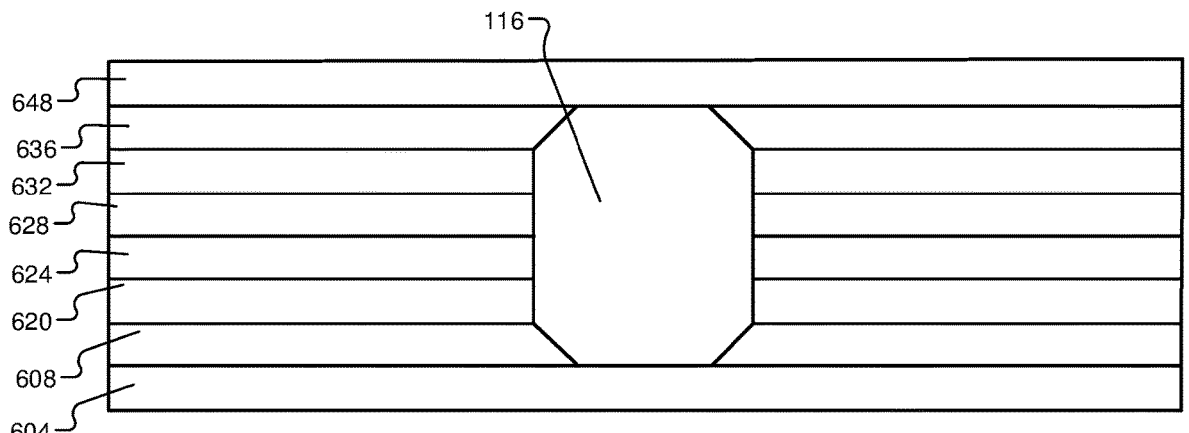

In FIG. 6F, one or more other manufacturing processes may be performed to produce the baseplate 103. For example, pressure may be applied to the green body (including the ceramic layers) that will become the baseplate 103. The green body may be sintered by heating the green body at the predetermined temperature for the predetermined period in a furnace to form the baseplate 103. The baseplate 103 may also be machined to predetermined dimensions after the sintering. While FIGS. 6A-6F include cross-sectional side views, when viewed from the top, the openings extends around the second ceramic layer 608, such as a single fillar arrangement (e.g., FIG. 4), a bifilar arrangement (e.g., FIG. 3), or another arrangement.

Figure 8:
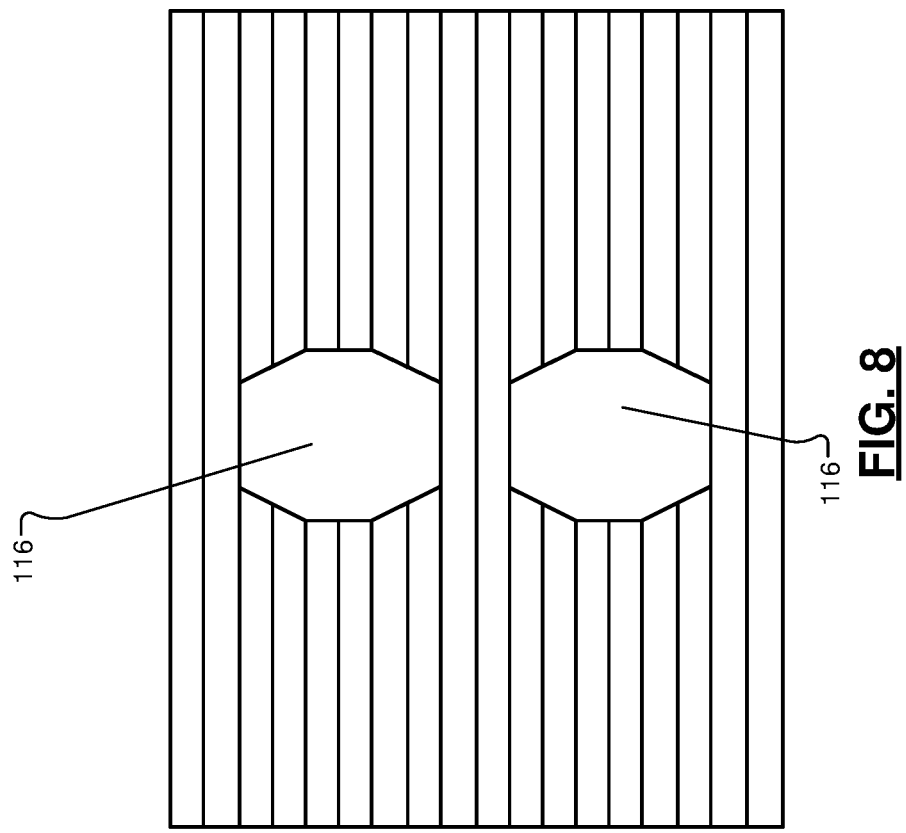
FIG. 8 includes a cross-sectional side view of a portion of an example ESC including channels with chamfered corners.
Figure 7:
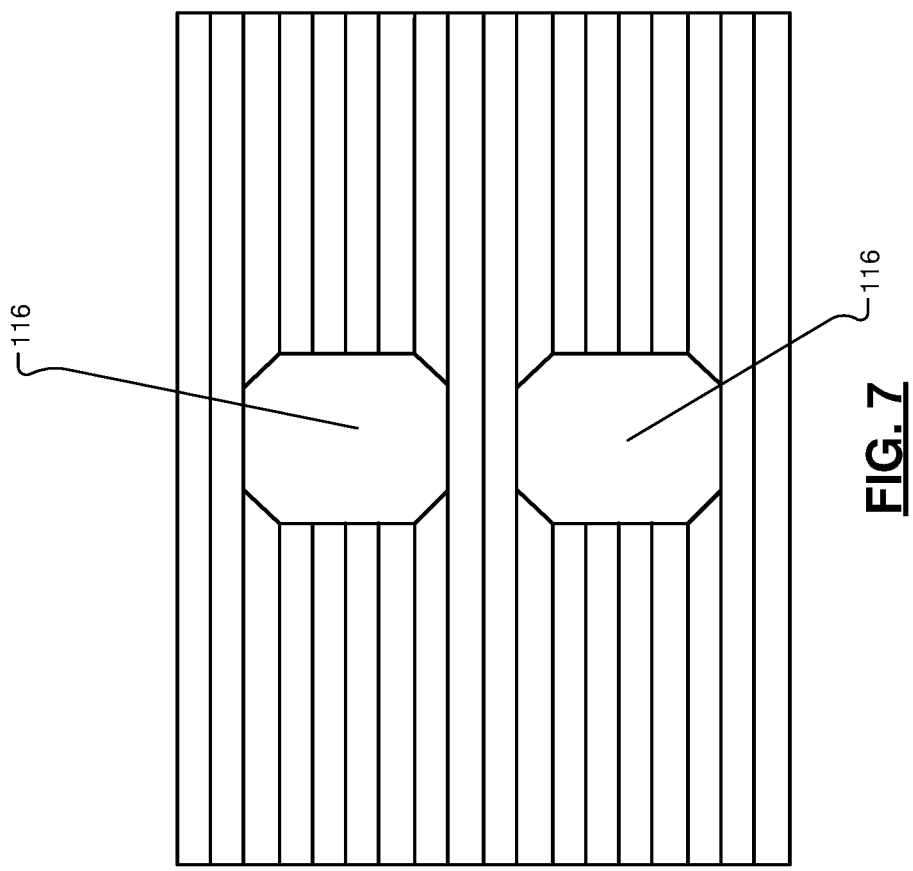
FIG. 7 includes a cross-sectional side view of a portion of an example ESC including two channels with chamfered corners.

FIG. 7 includes a cross-sectional side view of an example implementation of the ESC 101 including two of the coolant channels 116 with chamfered corners. While the example of the chamfers being formed via one upper ceramic layer and one lower ceramic layer is provided in FIGS. 6A-6F and 7, two or more upper ceramic layers and two or more lower ceramic layers may include openings formed with chamfered edges. For example, FIG. 8 includes a cross-sectional side view of an example implementation of the ESC 101 including two of the coolant channels 116 with two upper ceramic layers and two lower ceramic layers including openings formed with chamfered edges. While example chamfer angles are illustrated, other chamfer angles may be used. The chamfer angle may be, for example, 45 degrees, 30 degrees, 15 degrees, or another suitable chamfer angle.

Figure 9:
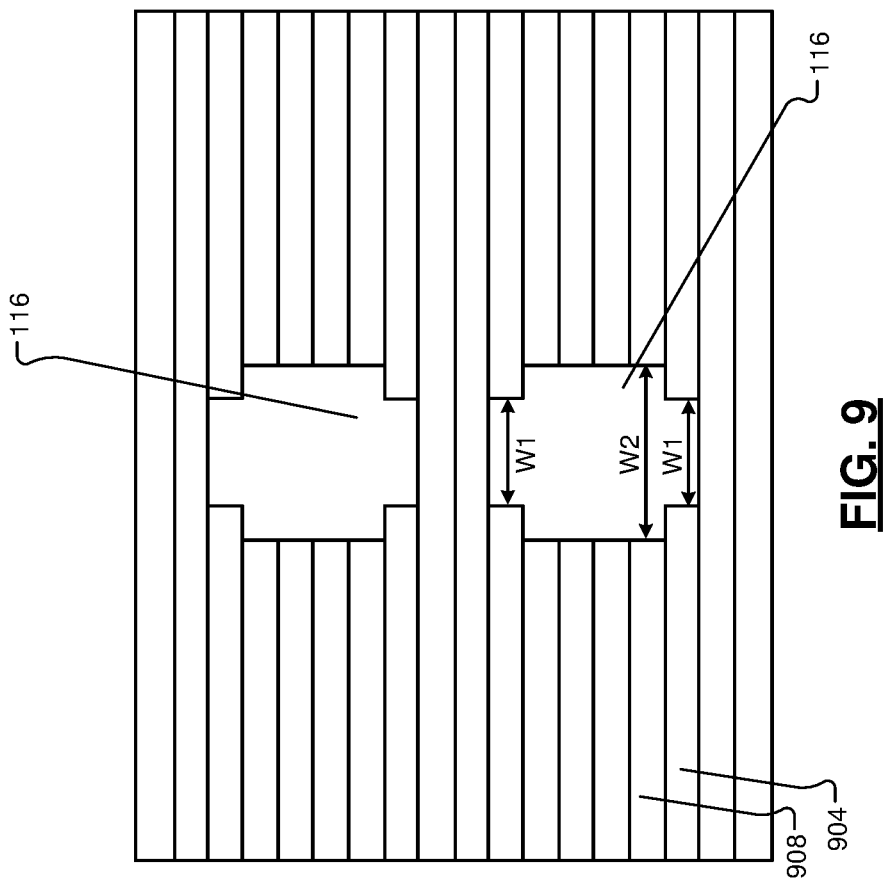
FIG. 9 includes a cross-sectional side view of a portion of an example ESC including two channels with staired corners.

While the example of coolant channels with chamfered corners has been discussed, the coolant channels 116 may alternatively have staired (or stepped) corners. FIG. 9 includes a cross-sectional side view of an example implementation of the ESC 101 including two of the coolant channels 116 with staired corners. To form the stairs, the ceramic layers have openings with straight (vertical) openings. The width of the openings, however, varies from one ceramic layer to the next ceramic layer.

For example, a first ceramic layer 904 includes a first opening having a first width (W1). A second ceramic layer 908 includes a second opening having a second width (W2) that is greater than the first width (W2>W1). In various implementations, the coolant channels 116 may have a combination of chamfered and staired corners.

Figure 10:
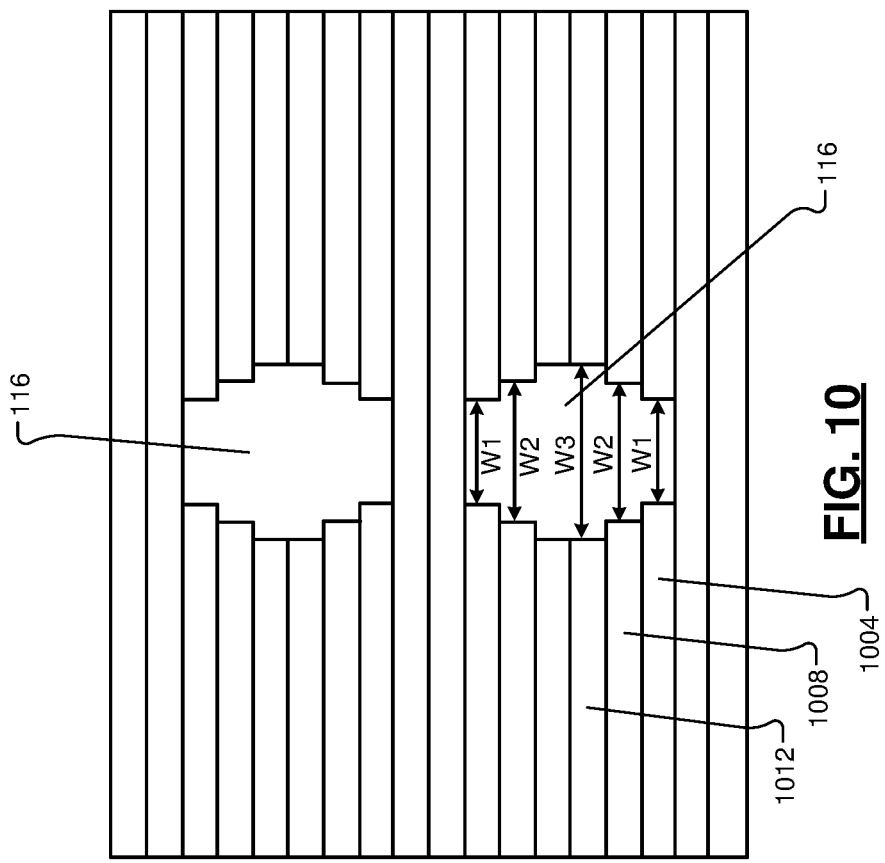
FIG. 10 includes a cross-sectional side view of a portion of an example ESC including two channels with staired corners.

While the example of the stairs being formed via one upper ceramic layer and one lower ceramic layer is provided in FIG. 9, two or more upper ceramic layers and two or more lower ceramic layers may form stairs. For example, FIG. 10 includes a cross-sectional side view of an example implementation of the ESC 101 including two of the coolant channels 116 with two upper ceramic layers and two lower ceramic layers including stairs.

For example, a first ceramic layer 1004 includes a first opening having a first width (W1). A second ceramic layer 1008 includes a second opening having a second width (W2) that is greater than the first width (W2>W1). A third ceramic layer 1012 includes a third opening having a third width (W3) that is greater than the second width (W3>W2). The width(es) of the opening(s) of the upper ceramic layer(s) may be the same as or different than the opening(s) of the lower ceramic layer(s).

As shown, the one of the coolant channels 116 includes a cross-section that has a first wall and a second wall opposing the first wall (e.g., the left and right walls). Each of the first and second walls have a first plurality of sections, and at least two or more of the first plurality of sections are not co-planar. The one of the coolant channels 116 includes more than four internal walls and more than four internal corners where the more than four internal walls intersect.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A substrate support for a substrate processing chamber, the substrate support comprising:
  a first plate configured to support a substrate; and
  a second plate that is made of a ceramic, that is connected to the first plate, and that includes at least one of:
    an internal coolant channel that is configured to receive coolant and that includes chamfered internal corners; and an internal gas channel that is configured to receive gas and that includes chamfered internal corners, wherein:

the second plate includes N layers of ceramic material;

N is an integer greater than or equal to seven; and a vertical height of the at least one of the internal coolant channel that includes chamfered internal corners and the internal gas channel that includes chamfered internal corners is defined by at least five of the N layers of ceramic material.

2. The substrate support of claim 1 wherein the ceramic of the second plate has a purity of at least 90 percent ceramic.

3. The substrate support of claim 1 wherein the second plate includes the internal coolant channel, and the internal coolant channel is arranged in a single fillar arrangement.

4. The substrate support of claim 1 wherein the second plate includes the internal coolant channel, and the internal coolant channel is arranged in a bifillar arrangement.

5. The substrate support of claim 1 wherein the second plate includes the internal gas channel, and the internal gas channel is arranged in a single fillar arrangement.

6. The substrate support of claim 1 wherein the second plate includes the internal gas channel, and the internal gas channel is arranged in a bifillar arrangement.

7. The substrate support of claim 1 wherein the second plate includes the internal gas channel, wherein the internal gas channel is configured to flow the gas to a surface of the substrate through the first plate.

8. The substrate support of claim 1 wherein the second plate further includes at least one electrode that is embedded in the second plate.

9. The substrate support of claim 8 wherein the second plate further includes at least one electrically conductive terminal that is embedded in the second plate and that contacts the at least one electrode.

10. The substrate support of claim 1 wherein no electrodes are embedded in the second plate.

11. The substrate support of claim 1 wherein:

N is an integer greater than or equal to eight; and the at least one of the internal coolant channel and the internal gas channel is defined by at least eight of the N layers of ceramic material.

12. The substrate support of claim 11 wherein:

a first pair of the chamfered internal corners of the at least one of the internal coolant channel and the internal gas channel extend vertically through a first two layers of the N layers of ceramic material;

a second pair of the chamfered internal corners of the at least one of the internal coolant channel and the internal gas channel extend vertically through a second two layers of the N layers of ceramic material; and the first two layers are different than the second two layers.

13. The substrate support of claim 1 wherein the chamfered internal corners of the at least one of the internal coolant channel and the internal gas channel include 45 degree chamfered internal corners.

14. The substrate support of claim 1 wherein the chamfered internal corners of the at least one of the internal coolant channel and the internal gas channel include 30 degree chamfered internal corners.

15. The substrate support of claim 1 wherein the chamfered internal corners of the at least one of the internal coolant channel and the internal gas channel include 15 degree chamfered internal corners.

16. A substrate support for a substrate processing chamber, the substrate support comprising:

a first plate configured to support a substrate; and a second plate that is made of a ceramic, that is connected to the first plate, and that includes at least one of:

an internal coolant channel that is configured to receive coolant and that includes chamfered internal corners; and an internal gas channel that is configured to receive gas and that includes chamfered internal corners, wherein:

the second plate includes N layers of ceramic material;

N is an integer greater than or equal to five;

a first pair of the chamfered internal corners of the at least one of the internal coolant channel and the internal gas channel extend vertically through a first two layers of the N layers of ceramic material;

a second pair of the chamfered internal corners of the at least one of the internal coolant channel and the internal gas channel extend vertically through a second two layers of the N layers of ceramic material; and the first two layers are different than the second two layers.

* * * * *